(12) United States Patent
Hoffman

(10) Patent No.: US 6,194,066 B1
(45) Date of Patent: Feb. 27, 2001

(54) MICROSCOPIC TUBE DEVICES AND METHOD OF MANUFACTURE

(75) Inventor: Wesley P. Hoffman, Palmdale, CA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 08/229,962

(22) Filed: Apr. 15, 1994

Related U.S. Application Data

(63) Continuation-in-part of application No. 07/980,317, filed on Nov. 16, 1992, now Pat. No. 5,352,512, which is a continuation-in-part of application No. 07/691,582, filed on Apr. 24, 1991, now abandoned.

(51) Int. Cl.⁷ ...................................................... D02G 3/00
(52) U.S. Cl. ........................... 428/367; 428/398; 428/401
(58) Field of Search ............................................. 428/367

(56) References Cited

U.S. PATENT DOCUMENTS

| | | | |
|---|---|---|---|
| 4,257,157 | * | 3/1981 | Pollock et al. ...................... 428/368 |
| 4,900,483 | * | 2/1990 | Witzke et al. ....................... 264/29.2 |
| 4,982,068 | * | 1/1991 | Pollock et al. ....................... 428/376 |
| 5,011,566 | * | 4/1991 | Hoffman .............................. 156/643 |
| 5,094,906 | * | 3/1992 | Witzke ................................ 428/220 |
| 5,298,298 | * | 3/1994 | Hoffman ............................. 428/34.4 |
| 5,352,512 | * | 10/1994 | Hoffman ........................... 428/311.5 |

* cited by examiner

*Primary Examiner*—Christopher Raimund
(74) *Attorney, Agent, or Firm*—Stanton E. Collier; Thomas C. Stover

(57) ABSTRACT

The invention comprises devices composed of at least one microscopic hollow tube having a wall of single or multiple layers with a thickness of at least one nanometer and a diameter of at least 5 nanometers. The tubes can be formed from a wide variety of materials, some of the preferred materials include metals, polymers, silica, carbon, carbides, nitrides and oxides. The inside of the tubes can be coated with a desired material such as a catalyst. The tubes further may act as devices upon which materials can be deposited which are not compatible with the fiber and further may have depressions or elevations therein that were imparted to the fibers upon which the tubes were formed. The wall layers may be porous for the purpose of removing the fiber therethrough. Further the hollow tubes can be used in a preform by themselves or serve the purpose of being used to form rods or filaments in the desired configuration after the tubes are removed.

24 Claims, 6 Drawing Sheets

MICROSCOPIC TUBE DEVICES AND METHOD OF MANUFACTURE

This application is a continuation-in-part of application Ser. No. 07/980,317, filed Nov. 16, 1992, now U.S. Pat. No. 5,352,512, which is a continuation-in-part of Ser. No. 07/691,582, filed Apr. 24, 1991, abandoned.

STATEMENT OF GOVERNMENT INTEREST

The invention described herein may be manufactured and used by or for the Government for governmental purposes without the payment of any royalty thereon.

BACKGROUND OF THE INVENTION

This invention relates to the manufacture of devices using microscopic hollow tubes which are particularly useful as lightweight, thermal barrier and heat exchange materials.

Lightweight, low mass material is widely used for thermal barrier protection shields and for lightweight structural components in devices such as aircraft components that place a premium on structurally strong lightweight materials. A variety of manufacturing methods are used to produce lightweight, structural materials. These methods include production of composite, non-metallic components and production of components having a reduced weight through the inclusion of spaces and holes. There are, however, limitations to the production of such reduced weight materials since conventional drilling of spaces and holes and electric die machining of holes are costly operations that raise the price of the final component. Other lightweight materials make use of fibers and laminations for producing components having good structural rigidity without the attendant weight of comparable metallic components. Production of materials having layers of fibers or fibrous material with ceramic or epoxy binders is also an expensive manufacturing procedure.

A need therefore exists for a new and inexpensive lightweight material suitable for use in lightweight components.

A need also exists for an improved method of manufacturing hollow materials that are particularly useful for thermal insulation and alternately for gas separation applications.

A further need exists for an inexpensive and efficient method of producing lightweight raw materials for use in the above-mentioned lightweight and thermal insulating components.

A further need exists for producing devices having microscopic hollow tubes therein having walls with multiple layers, having coatings thereon, etc.

SUMMARY OF THE INVENTION

The invention comprises a device composed of at least one microscopic hollow tube having a wall of single or multiple layers with a thickness of at least one nanometer and a diameter of at least 5 nanometers. The tubes can be formed from a wide variety of materials, some of the preferred materials include metals, polymers, silica, carbon, carbides, nitrides and oxides.

The invention also comprises a method for forming the microscopic hollow tube devices. The method begins with the step of positioning fibers having a predetermined rate of reaction or salvation at specific temperatures in a preform corresponding to a desired tube configuration. Although a random orientation may be used. The fibers are then cleaned and the temperature of the fibers is adjusted to a preferred deposition temperature in an inert environment. A tube material is then deposited on the fibers to coat them. Additional layers may be deposited of the same or different materials. The tube material has a lower rate of reaction or solvation at specific temperatures than the fibers. The coated fibers may then be heated in a solvent or reactive environment to a temperature at which is at least 10 times faster than the rate at which the fiber is removed at a rate which the fiber coating is removed. During this reaction or salvation, there is no ignition of the fiber material or build up of gas pressure that would damage the tubes which remain after the fiber is removed.

In a preferred embodiment of the invention, the tube material is deposited on the fibers by chemical vapor deposition after the fibers have been cleaned in a high vacuum environment. In one preferred embodiment of the invention the initial fibers comprise carbon fibers, however, practically any other microscopic fibers may be used. Silica and other high temperature oxides are preferred coating materials for the fibers in the preferred embodiment of the invention which utilizes carbon fibers.

In another preferred embodiment of the method of this invention, the metal or polymer fibers used for forming microscopic tubes are removed from the deposited tube material by means of a solvent or a dissolving acid. The solvent or dissolving acid dissolves the inner fiber but is incapable of dissolving the tube material.

BRIEF DESCRIPTION OF THE DRAWINGS

Examples of embodiments of the invention are illustrated in the accompanying drawings. The drawings are not intended to limit the invention in size or shape but rather to illustrate a typical product produced according to the principles of this invention.

The drawings have been made from scanning electron microscope photographs showing the ends of some representative microscopic hollow tubes produced accordingly to the principles of this invention.

DETAILED DESCRIPTION OF THE PREFERRED EMBODIMENT

Figure 1:
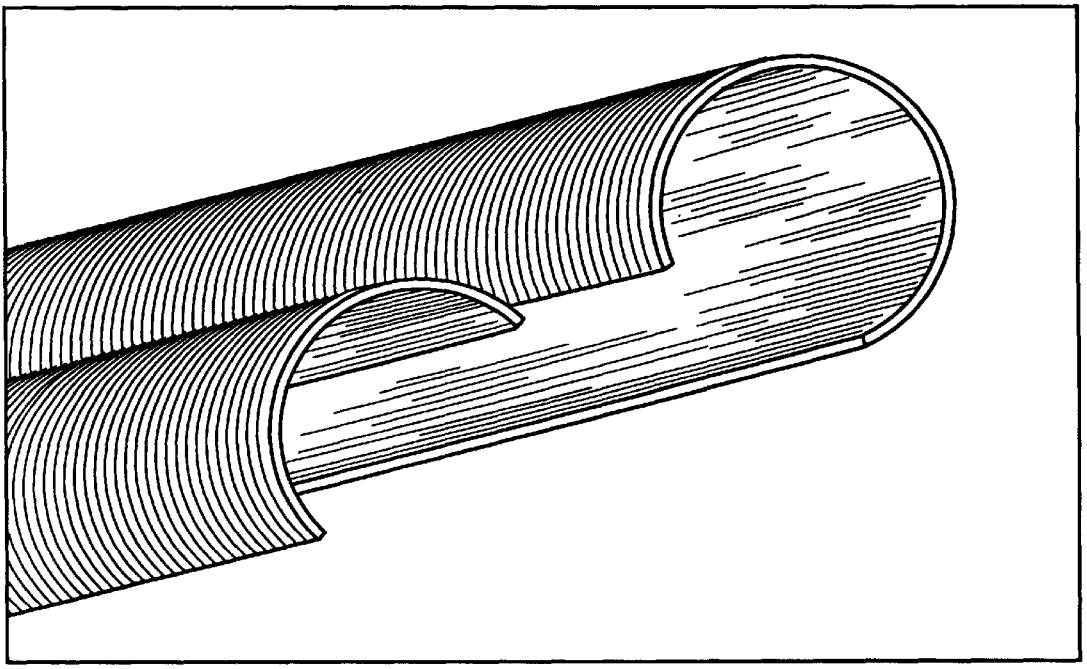
FIGS. 1 to 3 illustrate some of the various hollow tube shapes avialable by use of the present ivention.

This invention offers a unique method to fabricate straight, curved, or coiled hollow tube devices with tubes as small as 5 nanometers in diameter with wall thickness starting at about one (1) nanometer. These devices can be made from many of the materials that can be applied to a surface of carbon, graphite, polymer, metal, glass, or other tube forming fibers and then made to withstand the environment used to remove the fiber. The microscopic tubes are manufactured by applying at least one surface coating of material such as polymers, carbon, ferrous metal, non-ferrous metals, ceramic, oxides, nitrides, carbides, borides, semiconductor, glass, carbon or diamond to a microscopic fiber which is then removed. This coating can be applied by several processes which include but are not limited to chemical vapor deposition, sputtering, electrophoresis, plasma enhanced deposition and electroplating.

Prior to the coating process the fibers are fixed in the desired preform configuration, meaning the fibers are held or fixed in a desired shape, location and orientation to be rigid therein, and then cleaned to facilitate uniform deposition of a coating material in a non-oxidizing or inert environment. The fibers are coated with a desired material that will form the tubes when the fibers are removed. For example, carbon or graphite fibers can be removed from a silica coating by reaction with a gas phase species such as air, oxygen or hydrogen. A glass or quartz fiber, for example, can be easily removed with hydrofluoric acid while a polymer fiber can be removed with the appropriate solvent. Prior to removing the fiber, the ends of the coated fibers are cut to enhance the rate of removal of the fiber. The preferred method of removing other fiber materials depends on their chemical and physical structure. Once the fiber is removed, the microscopic tube of coating material or materials remains. These tubes have been found to be quite sound structurally. Even microscopic tubes made of quartz have been found to be very strong structurally. Specifically, quartz tubes with wall thickness of less than 0.01 microns have been found to be structurally sound.

Tubes formed in this way may be fabricated to stand alone in practically any shape imaginable, or the spaces between the final tubes can be filled in with the tube material or any other material while the fibers are still in place to produce a strong lightweight monolithic structure. If the matrix material is the same as the material of the tube wall, the process of tube forming and matrix filling can be a single step. However, processes for rapid filling of the space between the tubes, such as, using electrolysis or ceramic slurries do not produce as good tube walls as other processes, such as CVD or sputtering. Thus, a two step process is usually used to rapidly and inexpensively produce a monolithic structure with channels of high quality. Alternatively, the fiber can be removed prior to filling in the space between the tubes if the ends of the tubes are sealed to prevent entrance of the "matrix" material. This sealing material, of course, must be removed prior to using the device. The resulting channels can transport gas or liquid and also serve to lower structure weight through a reduction of density. Such structures utilize the innate high structural strength of hollow tubes to form strong structural components. Further, the hollow tubes form thermal barriers that reduce the passage of heat.

The basis for this invention is production of tubes of coating material that is not destroyed by the conditions used to remove the fibers. Two specific fabrication techniques for microscopic tube formation which utilize two different fiber substrates are presented below.

EXAMPLE 1

This example discloses the fabrication of quartz tubes and begins with a carbon or graphite fiber substrate. To form quartz tubes on graphitized carbon fibers it is preferred to start with unsized fibers as the substrate. Such fibers were laid up in a preform in a desired configuration and then cleaned of any absorbed material by heating to 950° C. in the inert environment of a high vacuum apparatus. This step is essential to maintain uniform deposition rates and high quality tube walls. After the fibers were cleaned, their temperature was lowered to the deposition temperature of the desired coating material. In this example silica was used to form the tube walls. For silica, the preferred deposition temperature is between 550° C. and 650° C. when tetra-ethoxysilane is used as the precursor. Deposition was carried out at 600° C. until the desired wall (coating) thickness was obtained. In this example a wall thickness of 0.20 microns of silica on the fiber surface was selected. This deposition could have been performed in either a flow or static reactor, but in this example a static reactor was used. In order to fabricate a monolithic piece of silica (embedding the carbon fibers) the deposition could have been continued in the reactor thus the silica acting as a bonding material. Alternately, the fiber preform can be removed from the reactor and densified with the same or different material by other means, such as, electrophoresis, electroplating, pack cementation, sol-gel, etc.

Figure 2:
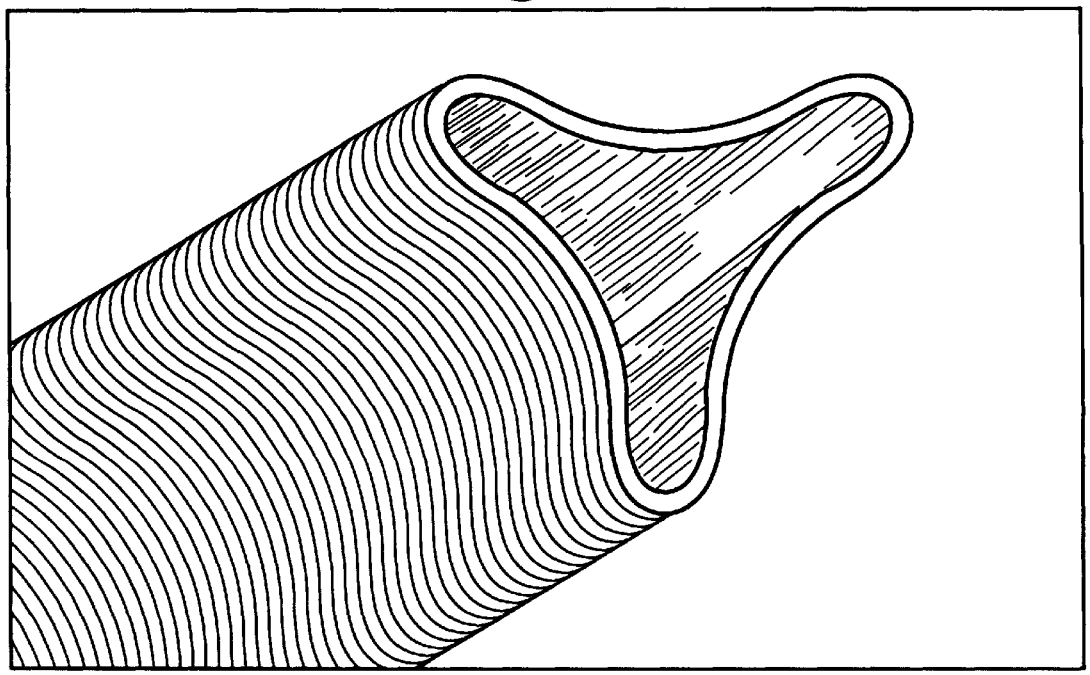
Figure 3:
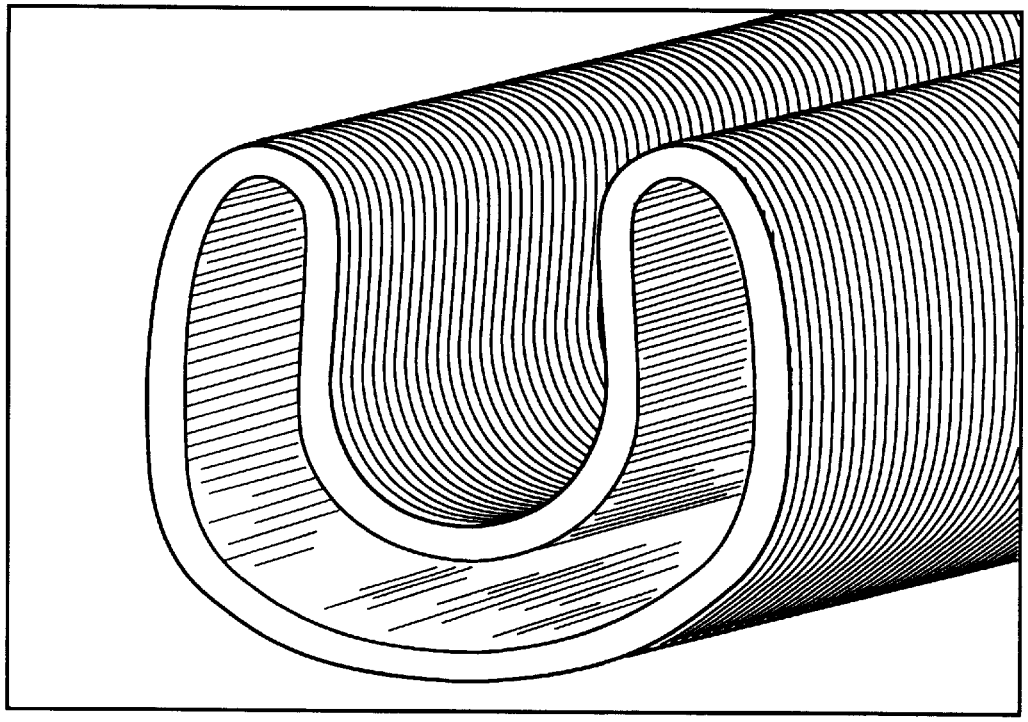

The removed preform had 0.2 microns of silica on the fiber surface. Having coated the tube forming fibers up to the desired depth the fibers were then oxidized in air after the coating on the ends was removed. The carbon fibers were completely oxidized at 700° C. in air although silica tube material can withstand temperatures in excess of 1000° C. For coating materials that oxidize with detrimentally high rates at 700° C., lower temperatures must be used. It should be noted, however, that the rate of carbon oxidation decreases with temperature and approaches a negligible rate at 450° C. Using this method, the carbon disappeared leaving individual stand alone silica tubes, with length to diameter ratios in excess of 1500. The internal diameter was 10 microns with a wall thickness of 0.2 microns. The tubes of example 1 are shown in the drawings of FIGS. 1 to 3.

EXAMPLE 2

Figure 4:
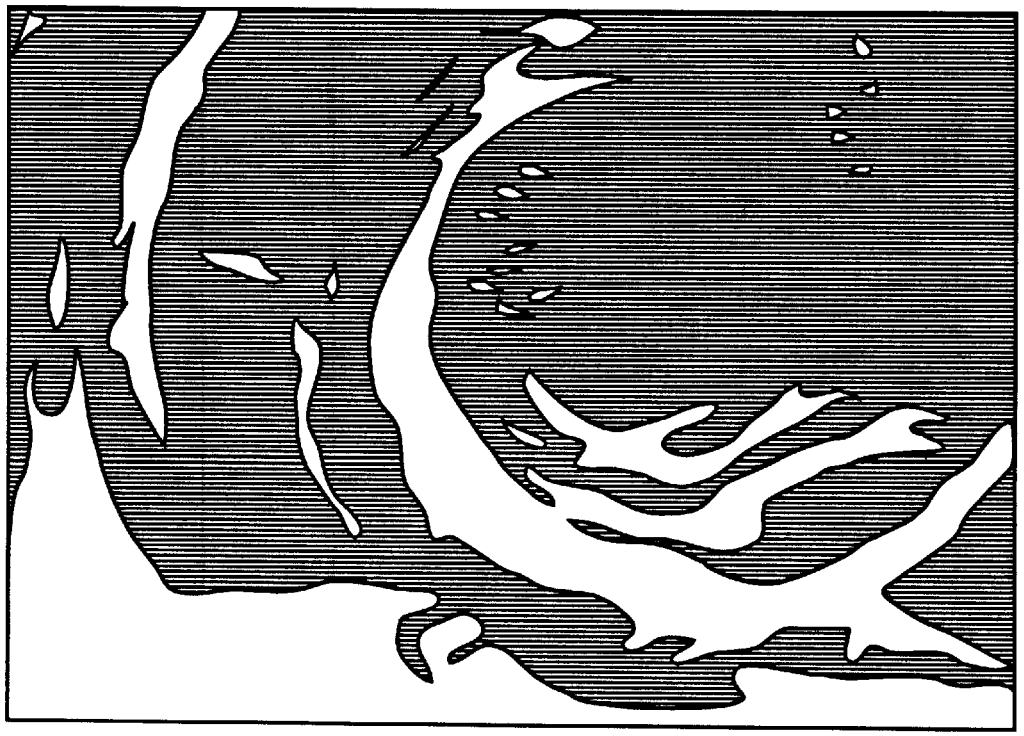
FIG. 4 illustrates a hollow tube surrounded by a material.

To form carbon or graphite tubes from quartz fibers the process is very similar to that just described. After the quartz fibers are laid up in the desired configuration and cleaned, the temperature is adjusted for the appropriate deposition. The deposition temperature depends on the type of hydrocarbon used. In this example, propylene was used to deposit a carbon coating, this required a deposition temperature greater than 650° C. in order to get a measurable deposition rate. If methane had been used to deposit carbon on the quartz fiber the required deposition temperature would have been in excess of 900° C. The coated fiber was removed from the deposition reactor after the desired thickness of carbon had been deposited upon the quartz tube in a non-oxidizing environment. In FIG. 4, the deposition was continued until all the space between the coated fibers was filled. When the quartz fibers were removed with hydrofluoridic acid this resulted in a monolithic carbon device with microchannels. This process resulted in the formation of structurally stable carbon tubes.

The two examples described above demonstrate the manufacture of microscopic tubes (or passages in structures) orders of magnitude smaller than any previously known. The tubes have the orientation of the fibers according to the way they are laid out during deposition. Free-standing micro tubes with a diameter in the range of 5 nanometers–1000 microns can hereby be fabricated. It should be noted, however, that in sizes below 3.0 microns the fibers and tubes can become a health hazard similar to asbestos fibers. Thus care is needed in handling these fibers and tubes. When a monolithic device is formed by filling in the space between the coated fibers or tubes a multitude of micro channels are formed when the fibers are removed. Fabrication of materials having a multitude of microchannels will greatly reduce component weight without greatly affecting structural strength. In some instances proper tube orientation will actually give a micro channel lightweight material greater strength and less weight than amorphous structures.

Microtubes used in these devices can be made with numerous layers in the wall if the fiber is coated with layers of material before the fiber is removed, but removing the fiber before the layers are all completed is clearly possible. This layering process would have many different applications. These multiple layers would be useful as part of a device such as a multiple electrical conductor in which there are alternate layers of conducting and insulating materials. The tube interior could be used for containing a cooling medium. In addition, it is sometimes useful to apply an easily removable sacrificial layer to the fiber so that the deposition of the actual tube material can be enhanced. For instance, to make a diamond tube it would be advantageous to apply a molybdenum coating to a fiber surface to enhance the formation of a diamond coating. Both the carbon fiber and the molybdenum layer would then be removed leaving a diamond tube.

Another purpose for layers in the tube wall is to form a protective coating for the tube material itself. Thus, if the tube wall needed for the particular application was susceptible to oxidation or corrosion, it could be coated with a layer of a material that does not oxidize or corrode under the conditions of the particular application.

Figure 7:
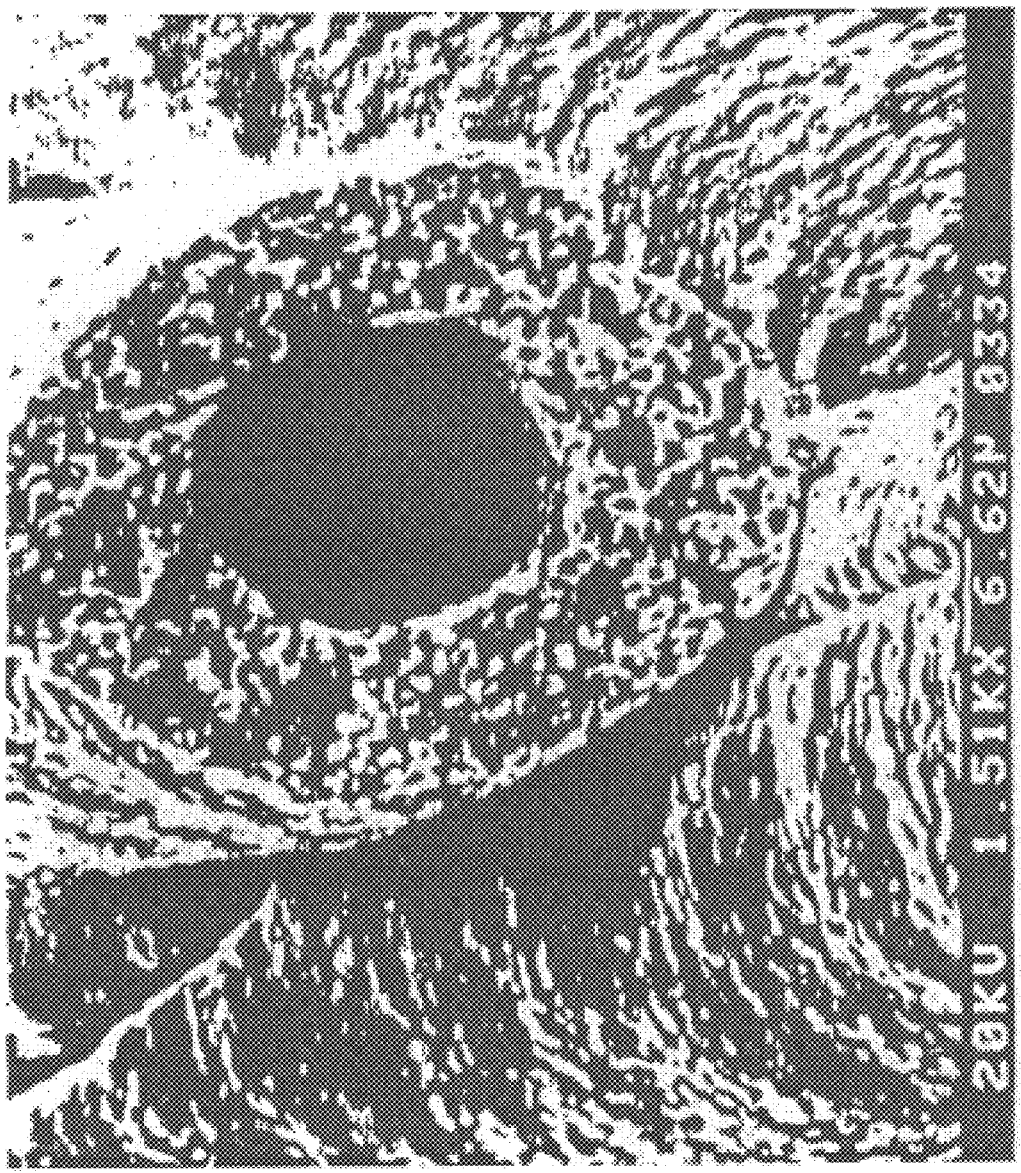
FIG. 7 illustrates a hollow tube being of porous nickel with pores running longitudinally.
Figure 8:
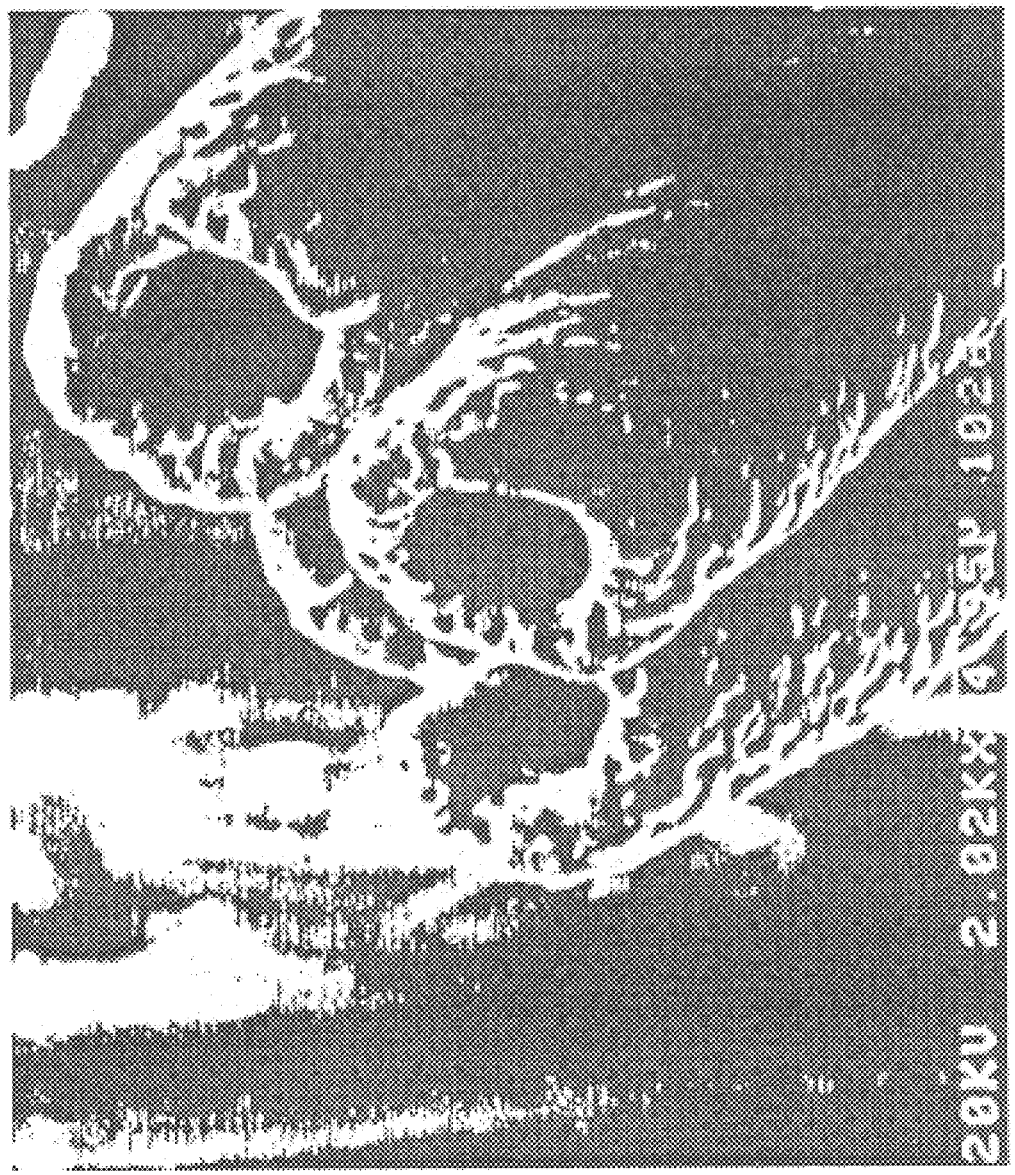
FIG. 8 illustrates a hollow tube being of porous nickel with pores radial to the tube axis.

Multiple tube wall layers can also be useful to extend the maximum length of the microtubes. That is, if the fiber coating is impervious, the rate of removal of the fiber will be limited by the rate of diffusion of the solvent or reactive medium down the interior of the tube from the ends. The longer the tube the longer it will take to remove the fiber. Under these conditions, there will be a maximum tube length that will be dictated by the economics of the fiber removal process. The diffusional length limitation can be avoided by applying a porous layer to the fiber which is substantially longer than its diameter and then removing the fiber by allowing the solvent or reactive medium to go through the porous tube wall. FIGS. 7 and 8 illustrate different porous wall tubes which were made of porous nickel. The actual impervious tube wall could then be applied to the exterior of the porous tube wall after the fiber had been completely removed. Since the removal of the fiber in this process is no longer limited by diffusion of the reactive medium down the tube from the ends, there would no longer be a limitation in microtube length.

Figure 5:
FIGS. 5 and 6 illustrate a hollow tube of sapphire with a silver lining.
Figure 6:
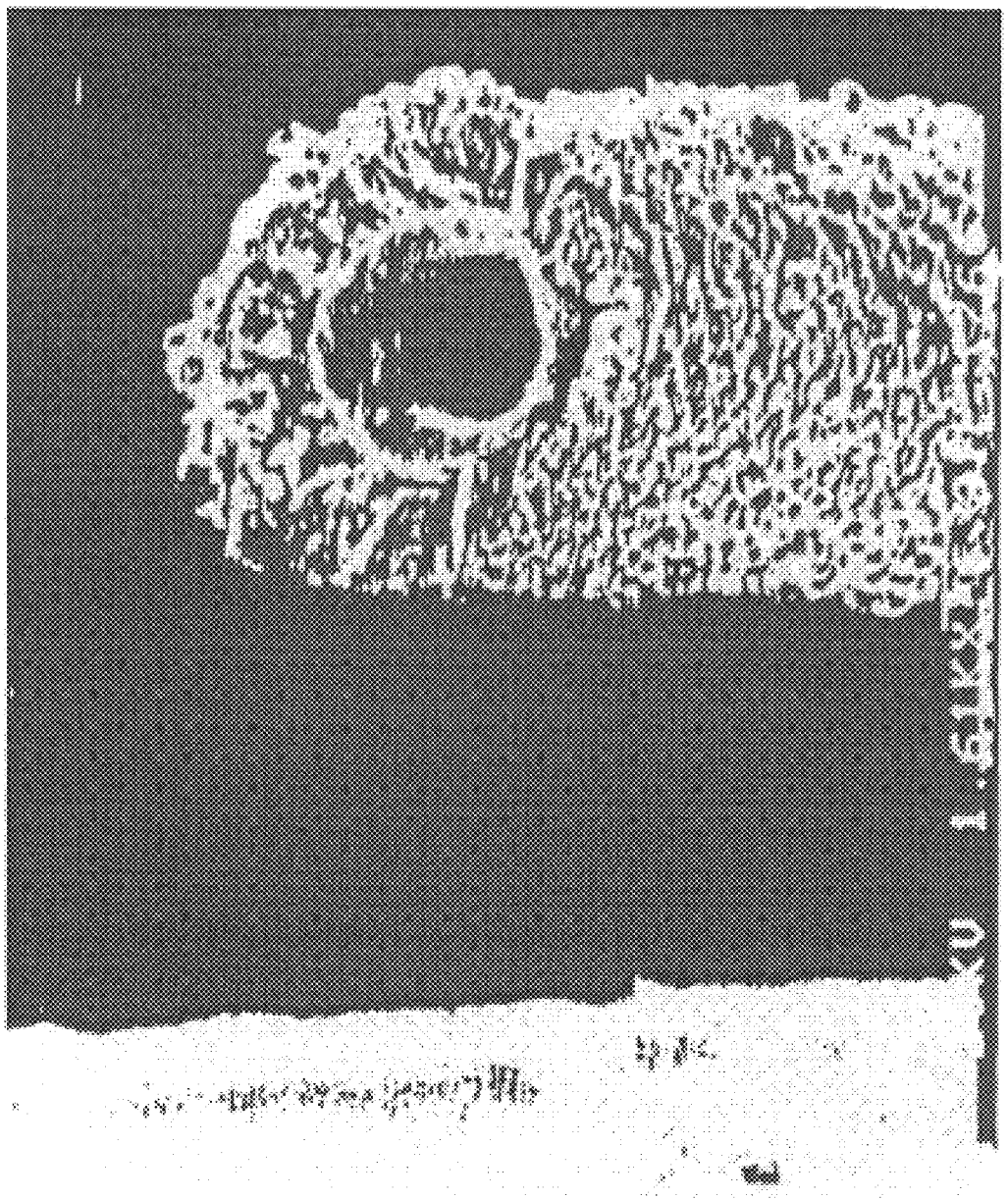

Besides coating the outside of the tube it is also sometimes advantageous. to coat the inside of microtubes for applications such as catalysis. This can be done in several ways. One can start with impurities in the fiber itself. After the fiber is coated with the tube material, it can be oxidized out. Some of the impurities in the fiber will then deposited on the inside of the tube wall. Alternatively, the fiber can be coated with a partial monolayer of material and then subsequently coated with the tube material. FIGS. 5 and 6 illustrate sapphire tubes with a silver lining being of the order of 5 to 10 microns. A thin layer of silver was deposited on a fiber and then aluminum was deposited on the silver and then oxidized to form sapphire. After this the fiber was removed leaving the silver. When the fiber is removed, a dispersed coating of, for example, a catalyst will be left on the inside of the tube. A third option is to completely coat the fiber prior to the application of the actual tube material. When the fiber is removed a coated tube will result.

In addition to coatings, the inner tube surface can be textured to give any desired roughness. In order to texture the interior surface of the tube, the exterior surface of the fiber must be modified. This can be accomplished by preferential etching of the fiber surface or selective local deposition of a sacrificial material on the fiber surface before the tube material is applied. Both the fiber and the sacrificial material would then be removed.

For any microtube, after the fiber is removed and the tube is formed, the tube can be filled with another material to make a microsensor or a detector far smaller than is now available.

Structurally sound free-standing tubes can have a wall thickness of at least 5 nanometers.

The preferred fiber substrates for many tubes are carbon and graphite. Among their advantages, carbon and graphite are relatively chemically inert at temperatures below 2000° C. and do not react with most materials. In this case graphite does not outgas appreciably below 1500° C., so bubbles are not introduced into the tube structure during deposition. Further, graphite is a high temperature material that can be used to form tubes at higher temperatures than other fibers can survive. Other filaments, however, may be best for specific purposes. For example, quartz or metal fibers are probably the best for fabricating carbon, diamond and diamond-like tubes while polymer fibers are best for making polymer tubes and numerous other types of tubes that are adversely affected by heat and acids, or are easily oxidized.

If the high temperature tube material is changed or damaged in an oxidizing environment, a reducing environment can be used to remove the carbon fiber. Carbon can be removed at a significant rate in hydrogen by forming methane at 1000° C. If the carbon fiber has a thin layer of nickel on its surface, underneath the coating for the tube wall, the carbon fiber can be removed by catalytic hydrogenation at temperatures as low as 600° C.

Carbon fibers can be removed at a significant rate by exposure to oxygen or air at temperatures above 450° C. For forming tubes, the lower the carbon removal temperature the better. This is to minimize the rate of gasification so that gas pressure will not build up inside the tubes and fracture the thin tube walls.

This invention offers the ability to produce tubes out of a variety of materials with diameters in the nanometer range and walls of similar thickness. Any material with a melting point above approximately 450° C. can be used for deposition on a carbon or graphite fiber. These materials would include the elements listed below and compounds (ferrous and non-ferrous metals, alloys, oxide, nitrides, carbides, borides, etc.) with a melting or sublimation point greater than 450° C. We have chosen 450° C. because the rates of carbon and graphite oxidation decrease with temperature and approach a negligible rate at 450° C. Below 450° C. it would not be commercially feasible to remove the carbon fiber by gaseous oxidation although the carbon could be removed by atomic oxygen or acid treatment at elevated temperatures. The elements that we consider useful for deposition on carbon to form microscopic hollow tubes are:

| | | |
|---|---|---|
| BORON | MAGNESIUM | RUTHENIUM |
| CERIUM | MANGANESE | TANTALUM |
| CHROMIUM | MOLYBDENUM | THORIUM |
| COBALT | NICKEL | TITANIUM |
| COPPER | OSMIUM | TUNGSTEN |
| GOLD | PALLADIUM | ZIRCONIUM |
| HAFNIUM | PLATINUM | URANIUM |
| IRIDIUM | RHENIUM | |
| IRON | RHODIUM | |

In addition, materials that are not soluble in nitric acid or damaged by atomic oxygen can be used on carbon even if their melting point is below 450° C. Any material that is not attacked by hydrofluoric acid can be used for deposition on quartz fibers.

Additional features of the present invention involve the fiber element. For example, catalytic carbon fibers having a thickness of from 5 to thousands of nanometers can be used as sacrificial tube formers. They can be grown in linear form or can be coiled like a miniature spring. Further, the fibers may be made of glass, ceramic, metal or they may be made of polymers so that the fiber removal can occur at very low temperatures without using acid to prevent damage to the tube wall. Polymer fibers may be removed by using solvents, by chemical reaction at room temperature or by using heat. Glass and metal may be removed by, for example, acids. Further, these fibers (excluding catalytic carbon fibers) may have almost any shape that is extrudable from a die such as a "C", an "X", a "Y", a "V", etc.

Polymer fibers of the desired diameter as small as 0.1 microns and of the appropriate cross-sectional shape are coated with a different type of polymer, metal, ceramic, glass, etc. The coating can be deposited by techniques such as CVD, sol gel, plasma spray, coacervation, polymeric polymerization, PVD, etc. This coating process is performed at temperatures where both the fiber and the coating are stable and is preferably performed on a clean fiber surface. The temperature is usually below 300 degrees centigrade and can be performed with most coatings as low as room temperature if it is applied, for example, by magnetron sputtering.

After the coating has been deposited to the desired thickness (this can even fill in the volume between the fibers), the deposition process is terminated and the fiber is removed from the coating by dissolving the fiber. For low temperature polymeric coatings the fiber can be removed by an appropriate solvent that will not attack the coating. For example, polyacronitrile (PAN) fibers are soluble in tetramethylene sulfone; acrylic fibers are soluble in dilute bases; acetate fibers are soluble in methylene chloride, and nylon fibers are soluble in plenols, cresols, and formic acid. After the fiber has been removed, the solvent is removed by drying or other appropriate means. In the case of metal, ceramic, or glass coatings, for example, the polymer fiber can also be chemically removed at elevated temperature.

If polymer coatings are deposited on glass or metal fibers, these sacrificial tube formers can be removed at room temperature using an acid that will not harm the polymer coating. For example, hydrofluoric acid will attack metals and most glasses including quartz will not attack many polymers.

Using different sacrificial tube formers, the tube walls can be made of practically any material as noted above and can even be of complex composition. For example, alloy tubes such as those made of stainless steel can be fabricated by a sputtering process. Ceramic tubes of boron nitride, silicon carbide or aluminum oxide can be fabricated directly, for example, by a chemical vapor deposition process. Alternatively, the tube's final composition can be achieved during the forming process itself. For example, aluminum oxide tubes can be made by oxidizing an aluminum coating before the fiber is removed and a silicon carbide tube can be made by heating a silicon coated carbon fiber before the fiber is removed.

After the tubes have been formed as noted above, they can be filled with a desired material to make rods of the desired shape and composition after which the tube wall may be removed.

A preform, being an object having a unique shape, is made when the fibers of the desired shape and diameter are positioned and oriented in a desired manner such as by bonding the fibers together or having the fibers held in position by a fixture. Material is then deposited onto the fibers to a desired thickness and the fibers are then removed. Spaces between the tubes may or may not be filled with other types of material or the same material as the tube wall forming a monolithic body.

A monolithic body can be formed by the above fibers having different lengths, cross sectional areas and shapes. These fibers can also be randomly oriented in the body. The tubes are formed essentially as noted above. The spaces between the tubes can be completely filled before the fibers are removed to produce a composite body and even the tubes themselves can be filled with another material to produce a micro-sensor or micro-display element.

The devices made with the tubes of this invention form a unique and valuable raw material and product that can be fabricated into composites used in lightweight high strength structures. These hollow tubes, because of their extremely low weight yet relatively high strength, form the ideal material for the lightweight composite structures for the aircraft and spacecraft of the future.

So called "breathing structures" can also be made of these tubes that will allow gas transfer in only selected directions. Further, the hollow spaces in the tubes impede heat transfer when appropriately encapsulated. Such lightweight heat shield structures are in great demand for hypersonic air vehicles and spacecraft.

Through careful fabrication, a variety of other devices can be produced using the microscopic hollow tubes; these include high efficiency heat exchanges and micro heat exchanges. Extremely accurate injectors for liquid fuel rocket engines can be designed by carefully controlling the form and internal diameter of the encapsulated tubes. Other potential uses include low cost gas separation systems and light intensifier arrays. Microscopic, hollow tubes and structures having microscopic holes or channels clearly have almost innumerable applications in the fields of lightweight structures, rocket propulsion, medicine, optics, micro hydraulics and electronics.

While the invention has been described with reference to the preferred embodiments thereof it will be understood by those skilled in the art that various changes in substance and form can be made therein without departing from the scope and spirit of the invention as detailed in the appended claims.

Cleary, many modifications and variations of the present invention are possible in light of the above teachings and it is therefore understood, that within the inventive scope of the inventive concept, the invention may be practiced otherwise than specifically claimed.

What is claimed is:

1. A microscopic hollow tube, said microscopic hollow tube comprising: a tubular wall, said tubular wall being made of a porous material, said porous material having a plurality of pores therein of such a nature as to have allowed solvents or reactive material to pass therethrough in the process of removing the fibrous material about which the tubular wall had been initially formed, said tube having an inside diameter of 10 nanometers to about 100 microns.

2. A microscopic hollow tube as defined in claim 1 wherein said pores having a preselected orientation, said orientation is either longitudinal or radial.

3. A microscopic hollow tube as defined in claim 1 wherein said tubular wall is made of porous nickel.

4. A device comprising one or more discrete microscopic hollow tubes, each of said one or more tubes being formed upon a discrete catalytic carbon fiber not in contact with other discrete fibers, having a diameter of from about 5 to several thousand nanometers, said catalytic carbon fiber material having been removed by salvation or reaction to leave said one or more discrete microscopic hollow tubes, the wall material of said one or more discrete microscopic hollow tubes comprising at least two distinct layers, each layer having a thickness of at least 1 nanometer.

5. A device comprising one or more discrete microscopic hollow tubes, each of which was formed by depositing wall-forming material on and about one or more discrete fibers not in contact with other discrete fibers, made of a material selected from the group consisting of polymeric material, glass, ceramic, metal and carbon, the wall-forming material of said one or more discrete microscopic hollow tubes being selected from the group consisting of alloys and compounds, the wall-forming material of said one or more tubes comprising at least two distinct layers and said one or more fibers having been removed by salvation or reaction to form said one or more discrete microscopic hollow tubes.

6. A preform comprising one or more discrete fibers having a diameter of from about 5 to about several thousand nanometers which are removable by solvation or reaction and which are not in contact with other discrete fibers, said one or more discrete fibers having been provided with one or more coatings on and thereabout, each coating having a thickness of at least 1 nanometer comprising a material relatively unaffected by the conditions of solvation or reaction used to remove the material of which the fibers are composed.

7. A process for forming microscopic hollow tubular material having multilayered walls, said process comprising the steps of:
  selecting at least one or more discrete fibers having a diameter of at least 5 nanometers;
  preparing said one or more discrete fibers for deposition of material thereon and thereabout;
  depositing at least two distinct layers on and about said one or more discrete fibers, each of said layers having a thickness of at least 1 nanometer; and
  removing said one or more discrete fibers by salvation or reaction whereby one or more discrete microscopic hollow tubes having multilayered walls remain.

8. A process as defined in claim 7 wherein the first layer deposited is porous, said one or more fibers are removed by salvation or reaction through said porous layer and, after removal, at least one layer is deposited on said porous layer.

9. A process as defined in claim 7 wherein said one or more discrete fibers comprise one or more impurities, a portion of which persist on the inside wall of the microscopic hollow tubes formed.

10. A process as defined in claim 7 wherein each layer of the multi-layered tubular walls produced is composed alternately of an electrically conductive material and an electrically insulative material.

11. A process as defined in claim 7 wherein a first layer comprising an easily removable sacrificial layer is initially supplied to said one or more discrete fibers for the purpose of enhancing application of one or more additional layers on and about said one or more discrete fibers and the sacrificial layer, and the one or more discrete fibers and the sacrificial layer are removed by solvation or reaction.

12. A process defined in claim 11 wherein the material comprising said one or more fibers is carbon, said easily removable sacrificial layer is molybdenum and at least one of said at least two layers is diamond.

13. A process as defined in claim 7 wherein said tube walls consist of at least one layer serving to protect at least one other layer from chemical attack.

14. A process as defined in claim 7 wherein one of said at least two layers composing the wall is a catalytic material.

15. A process as defined in claim 7 further including texturing the surface of said one or more discrete fibers, the configuration of said texturing determining the configuration of the inner wall surface of the tube after removal of said one or more discrete fibers by solvation or reaction.

16. A process as defined in claim 7 wherein the inner wall layer is nickel, the one or more fibers are carbon, and said removing is effected by catalytic hydrogenation at temperatures as low as 600° C.

17. A process for forming microscopic rods or filaments of the desired cross-sectional shape, said process comprising the steps of:
  selecting one or more discrete fibers having a diameter of at least 5 nanometers and the cross-sectional shape desired;
  preparing said one or more discrete fibers for depositing layers thereon and thereabout;
  depositing a tubular wall layer with a thickness of at least 1 nanometer on and about said one or more discrete fibers;
  removing by solvation or reaction said one or more discrete fibers while leaving microscopic tubular material;
  filling said microscopic tubular material with a desired rod or filament material; and
  removing by salvation or reaction said tubular material while leaving said rod or filament material of said desired cross-sectional shape.

18. A preform comprising:
  one or more filled discrete microscopic tubes having a diameter of at least 5 nanometers and a wall thickness of at least 1 nanometer formed by depositing a tubular wall layer on and about said discrete fibers, said wall layer being composed of at least two coatings;
  removing by solvation or reaction the material of which said discrete fibers were formed thereby providing one or more discrete position fixed microscopic hollow tubes; and
  filling said one or more position fixed discrete microscopic hollow tubes with a filling material having a chemical composition differing from the chemical composition of the fibers upon which the one or more discrete tubes were initially formed.

19. A monolithic body comprising:
  one or more discrete microscopic hollow tubes in either a preselected or random orientation, the fiber material upon which said microscopic tubular material was initially formed having been removed by solvation or reaction, said discrete microscopic hollow tubes having a diameter of at least 5 nanometers; and
  a material filling the spaces around said one or more discrete microscopic hollow tubes, said filling material being either the same or of different chemical composition than the chemical composition of the tubular wall-forming material, said filling material having been placed around said one or more discrete microscopic hollow tubes after tubular element arrangement in the desired manner.

20. A monolithic body as defined in claim 19 wherein said tubes are filled.

21. A microscopic filled tube-containing device comprising:
  one or more discrete microscopic hollow tubes, the wall-composing material of which comprises at least one layer having a thickness of at least 1 nanometer and is composed of an alloy or compound, said one or more discrete microscopic hollow tubes have an inside diameter of at least 5 nanometers, said one or more discrete microscopic hollow tubes having been formed by depositing tube wall-composing material on or about one or more discrete fibers not in contact with other discrete fibers prior to removal of the material composing said fibers, said tube wall-composing material having been unaffected by the conditions of the salvation or reaction removal; and a material filling said one or more discrete microscopic tubes, said filling material being of a different chemical composition than the composition of the fiber material upon which said one or more discrete microscopic tubes were initially formed.

22. A device comprising one or more discrete microscopic hollow tubes, said one or more discrete microscopic hollow tubes having been formed upon one or more discrete fibers not in contact with other discrete fibers, said one or more discrete fibers having been composed of a material selected from the group consisting of glass, ceramic, metal or polymer, said fiber material having been removed by solvation or reaction at a temperature lower than about 400° C. to prevent damage to the wall-forming material of said one or more discrete microscopic hollow tubes.

23. A device as defined in claim 22 wherein the material comprising said one or more discrete fibers was a polymer, the wall forming material of said one or more discrete microscopic hollow tubes is a polymer material different from the removed polymer material and comprises at least two distinct layers and said polymer fiber was removed by solvation.

24. A device comprising one or more discrete microscopic hollow tubes having been formed on and about one or more discrete extruded fibers having any shape extrudable from a die and the configuration of the inner surface of said one or more tubes expressing that shape, said one or more tubes having a diameter of from about 0.1 microns to about 1000 microns, the wall material of said one or more tubes comprising at least two distinct layers, and said one or more fibers having been removed by solvation or reaction to provide said one or more discrete microscopic hollow tubes.

* * * * *